(12) United States Patent
Shin et al.

(10) Patent No.: US 10,099,449 B2
(45) Date of Patent: Oct. 16, 2018

(54) METHOD OF FORMING A SUBSTRATE ASSEMBLY

(71) Applicants: Samsung Electronics Co., Ltd., Suwon-si, Gyeonggi-do (KR); Sungkyunkwan University Foundation for Corporate Collaboration, Suwon-Si, Gyeonggi-Do (KR)

(72) Inventors: Hyeon-jin Shin, Suwon-si (KR); Sang-Woo Kim, Seoul (KR); Jin yeong Lee, Seoul (KR)

(73) Assignees: SAMSUNG ELECTRONICS CO., LTD., Gyeonggi-Do (KR); RESEARCH & BUSINESS FOUNDATION SUNGKYUNKWAN UNIVERSITY, Gyeonggi-Do (KR)

( * ) Notice: Subject to any disclaimer, the term of this patent is extended or adjusted under 35 U.S.C. 154(b) by 0 days.

(21) Appl. No.: 15/628,891

(22) Filed: Jun. 21, 2017

(65) Prior Publication Data
US 2017/0282502 A1  Oct. 5, 2017

Related U.S. Application Data

(62) Division of application No. 14/063,529, filed on Oct. 25, 2013, now Pat. No. 9,738,057.

(30) Foreign Application Priority Data

Mar. 22, 2013 (KR) ........................ 10-2013-0030982

(51) Int. Cl.
C23C 16/34 (2006.01)
B32B 15/04 (2006.01)
(Continued)

(52) U.S. Cl.
CPC ............ *B32B 15/04* (2013.01); *C23C 16/342* (2013.01); *C23C 28/34* (2013.01);
(Continued)

(58) Field of Classification Search
CPC ........ C23C 16/34; C23C 16/342; C23C 16/06
See application file for complete search history.

(56) References Cited

U.S. PATENT DOCUMENTS

| 4,971,779 A | 11/1990 | Paine, Jr. et al. |
| 5,188,757 A | 2/1993 | Paine, Jr. et al. |

(Continued)

FOREIGN PATENT DOCUMENTS

| JP | 1995-089780 | 4/1995 |
| JP | 2009-298626 A | 12/2009 |

(Continued)

OTHER PUBLICATIONS

Kim, Ki Kang, et al., "Synthesis and Characterization of Hexagonal Boron Nitride Film as a Dielectric Layer for Graphene Devices". ACSNano, vol. 6, No. 10, 8583-8590, 2012.*

(Continued)

*Primary Examiner* — Bret P Chen
(74) *Attorney, Agent, or Firm* — Harness, Dickey & Pierce, PLC (57) ABSTRACT

A method of forming a substrate assembly includes preparing a substrate in a chamber, combining a solid-state nitrogen source and a boron source on the substrate, forming a metal layer on a surface of the substrate including the combined solid-state nitrogen and boron sources, and forming a first hexagonal boron nitride sheet directly bonded to the surface of the substrate by performing a heat treatment on the substrate including the metal layer and the combined solid-state nitrogen and boron sources.

11 Claims, 10 Drawing Sheets

(51) Int. Cl.
  *C23C 28/00* (2006.01)
  *H01L 21/02* (2006.01)
(52) U.S. Cl.
  CPC .... *H01L 21/02458* (2013.01); *B32B 2457/00* (2013.01); *Y10T 428/31678* (2015.04)

(56) References Cited

U.S. PATENT DOCUMENTS

| | | | |
|---|---|---|---|
| 5,204,295 | A | 4/1993 | Paine, Jr. et al. |
| 7,479,352 | B2 | 1/2009 | Yoon et al. |
| 7,516,671 | B2 | 4/2009 | Liu et al. |
| 8,158,200 | B2* | 4/2012 | Kelber .................. B82Y 30/00 427/249.1 |
| 8,663,591 | B2 | 3/2014 | Yoon et al. |
| 8,758,942 | B2 | 6/2014 | Yoon et al. |
| 9,187,332 | B2 | 11/2015 | Yoon et al. |
| 2008/0079075 | A1 | 4/2008 | Seon et al. |
| 2010/0156818 | A1 | 6/2010 | Burrough et al. |
| 2010/0289508 | A1 | 11/2010 | Joguet et al. |
| 2011/0163298 | A1 | 7/2011 | Sung |
| 2011/0256386 | A1* | 10/2011 | Shi ........................ C23C 16/342 428/336 |
| 2013/0140526 | A1* | 6/2013 | Kim ...................... C01B 21/064 257/29 |
| 2013/0240830 | A1* | 9/2013 | Seacrist ............ H01L 21/02458 257/9 |
| 2014/0263166 | A1 | 9/2014 | Shin et al. |
| 2015/0086460 | A1* | 3/2015 | Kim ................... C23C 18/1204 423/290 |

FOREIGN PATENT DOCUMENTS

| | | |
|---|---|---|
| KR | 10-0556265 B1 | 3/2006 |
| KR | 10-2009-0065205 A | 6/2009 |
| KR | 2010-0046152 A | 5/2010 |
| KR | 2010-0098706 A | 9/2010 |
| KR | 10-2011-0014446 A | 2/2011 |
| KR | 10-2011-0046863 A | 5/2011 |
| KR | 2011-0133965 A | 12/2011 |

OTHER PUBLICATIONS

Kim, Ki Kang, et al., "Synthesis of Monolayer Hexagonal Boron Nitride on Cu Foil Using Chemical Vapor Deposition". NanoLetters, 2012, 12, 161-166.*

Singh, Sandeep Kumar, et al., "Thermomechanical properties of a single hexagonal boron nitride sheet". Physical Review B 87, 184106 (2013), pp. 1-7.*

Zhen et al., "A Study of MIMIM On-Chip Capacitor Using Cu/SiO2 Interconnect Technology", IEEE Microwave and Wireless Components Letters, vol. 12, No. 7, Jul. 2002, pp. 246-248.

Kim et al., "Synthesis and Characterization of Hexagonal Boron Nitride Film as a Dielectric Layer for Graphene Devices", ACS Nano, 2012, 6 (10), pp. 8583-8590.

* cited by examiner

METHOD OF FORMING A SUBSTRATE ASSEMBLY

CROSS-REFERENCE TO RELATED APPLICATIONS

This application is a divisional application of U.S. application Ser. No. 14/063,529 filed on Oct. 25, 2013 and issued as U.S. Pat. No. 9,738,057 on Aug. 22, 2017, which claims the benefit under 35 U.S.C. § 119 of Korean Patent Application No. 10-2013-0030982, filed on Mar. 22, 2013, in the Korean Intellectual Property Office, the disclosure of each of which is incorporated herein in its entirety by reference.

BACKGROUND

1. Field

Some example embodiments relate to a substrate assembly, a method of forming the same, and/or an electronic device including the same. The substrate assembly, which includes a hexagonal boron nitride sheet, which is directly bonded to a surface of the substrate for use and the method of forming the substrate assembly do not need an additional transfer process. Thus, by directly bonding the hexagonal boron nitride sheet to the surface of the substrate, defects on the substrate assembly may be minimized, and the number of layers of the hexagonal boron nitride sheet may be easily adjusted.

2. Description of the Related Art

Hexagonal boron nitride is a material which has a two-dimensional (2D) structure. The hexagonal boron nitride is formed in a hexagonal arrangement of a boron atom and a nitrogen atom. The hexagonal boron nitride has electrical insulating characteristics due to a large bandgap of about 5.9 eV, and is physically and mechanically stable.

As a crystal of the hexagonal boron nitride has a hexagonal stacked structure, similarly to graphite, the crystal of the hexagonal boron nitride forms a very strong bonding and has lubrication. Additionally, the hexagonal boron nitride is a covalently bonding element with a low atomic number and has a high conduction quality. The hexagonal boron nitride sublimates at a temperature of about 3,000° C. without a melting point. Thus, the hexagonal boron nitride has high stability at a high temperature. The hexagonal boron nitride has a very high electric resistance, and has a resistance of 105Ω in a high temperature area. As the hexagonal boron nitride has highly stable hexagonal bonding, the hexagonal boron nitride has a high chemical stability. A true specific gravity of the hexagonal boron nitride, which is 2.28, is very low, compared to other ceramics. Thus, the weight of components used in an aircraft and a space material, may be made lighter.

As one of the methods of manufacturing the hexagonal boron nitride, an electronic device may be manufactured by growing the hexagonal boron nitride through a process of supplying boron and nitrogen sources to a metal catalyst and performing a heat treatment on the metal catalyst, and then, separating and transferring the hexagonal boron nitride to a given (or alternatively, predetermined) substrate. However, damage on the hexagonal boron nitride, such as tears or wrinkling defects, may be unintentionally generated in the transferring process. Furthermore, a thickness or the number of layers of a hexagonal boron nitride sheet may not be easily adjusted by controlling the amounts of the boron and nitrogen sources.

Accordingly, a substrate assembly, in which the hexagonal boron nitride sheet is directly bonded to a surface of the substrate and in which a thickness or the number of layers of the hexagonal boron nitride sheet may be easily controlled, and a method of forming the same are needed.

SUMMARY

Some example embodiments provide a substrate assembly which includes a first hexagonal boron nitride sheet that is directly bonded to a surface of a substrate.

Other example embodiments also provide a method of forming a substrate assembly which includes a first hexagonal boron nitride sheet directly bonded to a surface of a substrate.

Other example embodiments also provide an electronic device which includes the substrate assembly.

Additional aspects will be set forth in part in the description which follows and, in part, will be apparent from the description, or may be learned by practice of example embodiments.

According to an example embodiment, a substrate assembly includes a substrate, a first hexagonal boron nitride sheet directly bonded to a surface of the substrate, and a metal layer on the first hexagonal boron nitride sheet.

The first hexagonal boron nitride sheet may not have wrinkling defects in a region that amounts to 90% or more of an area of the substrate. The first hexagonal boron nitride sheet may include 1 to 100 layers. Boron nitride may constitute 95% or more per 1 mm$^2$ area of the first hexagonal boron nitride sheet. The metal layer may include a catalyst layer formed of one of at least one metal and an alloy thereof, the metal including one of nickel (Ni), cobalt (Co), iron (Fe), platinum (Pt), palladium (Pd), gold (Au), aluminum (Al), chrome (Cr), copper (Cu), magnesium (Mg), manganese (Mn), molybdenum (Mo), rhodium (Rh), silicon (Si), thallium (Ta), titanium (Ti), tungsten (W), uranium (U), vanadium (V), and zirconium (Zr).

A grain of the metal layer may have an average area of 1 μm$^2$ to 1,000,000 μm$^2$. The substrate assembly may further include a second first hexagonal boron nitride sheet on the metal layer. The substrate may include at least one of a metal or semimetal oxide-based substrate, a silica-based substrate, a boron nitride-based substrate, and a silicon-based substrate.

According to another example embodiment, a method of forming a substrate assembly includes preparing a substrate in a chamber, combining a solid-state nitrogen source and a boron source on the substrate, forming a metal layer on a surface of the substrate including the solid-state nitrogen and boron sources, and forming a first hexagonal boron nitride sheet directly bonded to the surface of the substrate by performing a heat treatment on the substrate including the solid-state nitrogen source, the boron source and the metal layer.

At least one of ammonia borane ($H_3NBH_3$), borazine (($BH)_3(NH)_3$), and polyborazylene may be combined on the substrate. The method may further include dissolving the solid-state nitrogen and boron sources in an organic solvent in a concentration range from 1 mM to 10M prior to the combining. The first hexagonal boron nitride sheet may be formed by simultaneously performing the heat treatment on the substrate and exposing the substrate to one of an inert gas, a hydrogen gas, and a mixture of an inert gas and a hydrogen gas. The heat treatment may be performed for 1 to 20 hours at a temperature of 100° C. to 2,000° C.

According to yet another example embodiment, a method of forming a substrate assembly includes preparing a substrate in a chamber, forming a metal layer on the substrate, and forming a first hexagonal boron nitride sheet between the substrate and the metal layer, the first hexagonal boron nitride sheet being directly bonded to a surface of the substrate. The first hexagonal boron nitride sheet is formed by applying at least one of a nitrogen source and a boron source in one of a gas and solid state to the substrate from outside the metal layer, and performing a heat treatment on the substrate.

The method may further include forming a second hexagonal boron nitride sheet prior to or simultaneously with the forming a first hexagonal boron nitride sheet. The heat treatment may be performed at a temperature of 100° C. to 2000° C. under one of an inert gas, a hydrogen gas, and a mixture of an inert gas and a hydrogen gas. A gas-state nitrogen source including at least one of $NH_3$ and $N_2$, and a gas-state boron source including at least one of $BH_3$, $BF_3$, $BCl_3$, $B_2H_6$, $(CH_3CH_2)_3B$, $(CH_3)_3B$, and diborane may be applied to the substrate from outside the metal layer. A solid-state boron source including $B_2O_3$ may be applied to the substrate from outside the metal layer. At least one of $H_3NBH_3$, $(BH)_3(NH)_3$, and polyborazylene may be applied to the substrate from outside the metal layer.

According to yet another example embodiment, an electronic device includes the substrate assembly.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Hereinafter, a substrate assembly, a method of forming the same, and an electronic device including the same, according to some example embodiments, will be described in detail. However, the description is only an example, and the scope of the inventive concepts is defined not by the detailed description but by the appended claims.

Figure 8A:
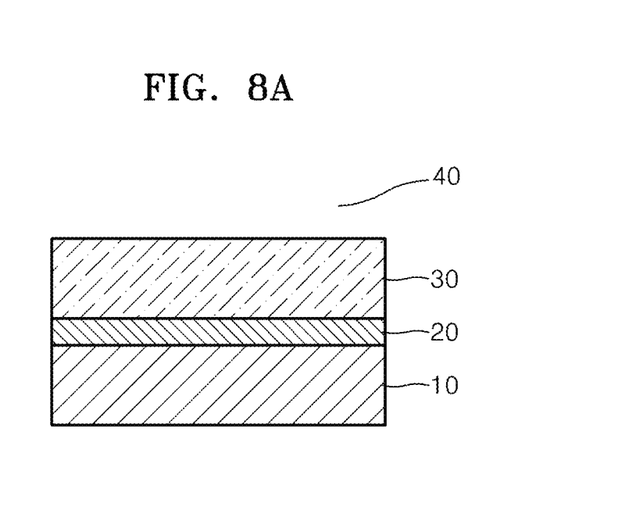
FIG. 8A is a schematic diagram illustrating the substrate assembly of Example 1.
Figure 8B:
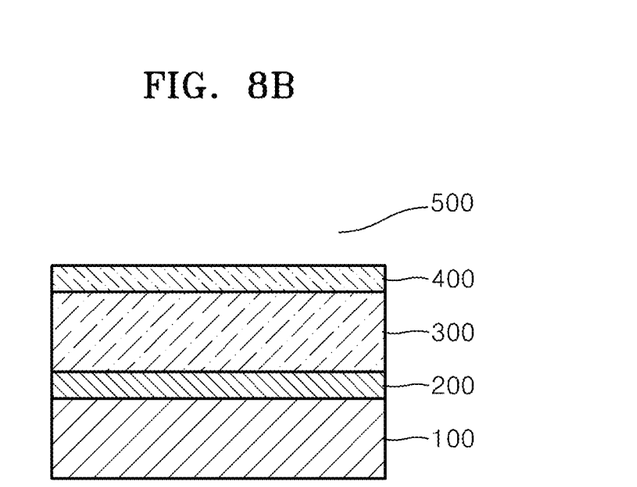
FIG. 8B is a schematic diagram illustrating the substrate assembly of Example 2.

FIG. 8A is a schematic diagram illustrating a substrate assembly 40 of an example embodiment, i.e. Example 1. FIG. 8B is a schematic diagram illustrating a substrate assembly 500 of another example embodiment, i.e. Example 2.

The substrate assembly 40, 500 includes a substrate 10, 100; a first hexagonal boron nitride sheet 20, 200 formed on the substrate 10, 100; and a metal layer 30, 300 formed on the first hexagonal boron nitride sheet 20, 200. The first hexagonal boron nitride sheet 20, 200 may be bonded directly to a surface of the substrate 10, 100.

Figure 9:
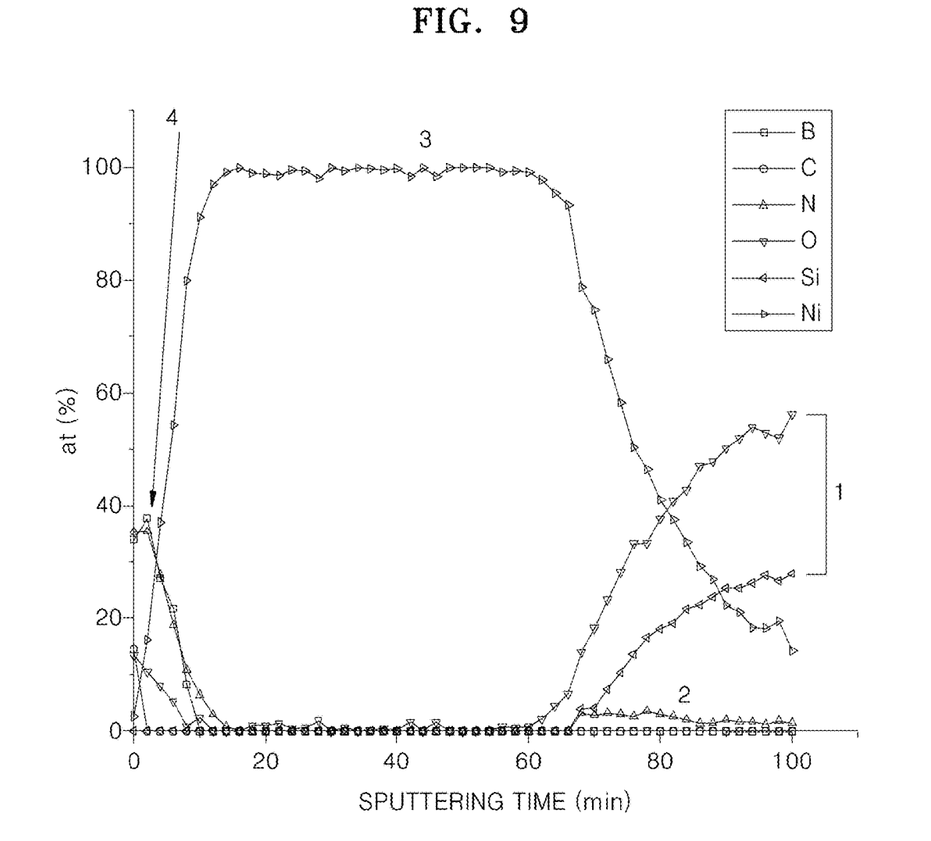
FIG. 9 is an X-ray photoelectron spectroscopy (XPS) depth profile graph obtained by analyzing a depth of the first and second hexagonal boron nitride sheets included in the substrate assembly of Example 2 by using an XPS surface analyzing apparatus.

In the description, "bonded directly to a surface of the substrate 10, 100" refers to chemically and/or physically bonding directly to a surface of the substrate 10, 100, and to a first hexagonal boron nitride sheet which is grown in-situ on the surface of the substrate 10, 100. Thus, unlike a hexagonal boron nitride sheet which is formed on an additional substrate, a strong bonding force between the substrate 10, 100 and the first hexagonal boron nitride sheet 20, 200 may be obtained. The first hexagonal boron nitride sheet 20, 200, which is bonded directly to the surface of the substrate 10, 100, may be identified from TEM images which are shown in FIGS. 3A, 4A, 5A, and 6A, a Raman spectrum which is obtained by using an $Ar^+$ ion laser with a wavelength of 514 nm, and an X-ray photoelectron spectroscopy (XPS) depth profile graph which is shown in FIG. 9.

The first hexagonal boron nitride sheet 20, 200 may not include wrinkling defects in a region that amounts to 90% or more of an area of the substrate 10, 100. For example, the first hexagonal boron nitride sheet 20, 200 may not include wrinkling defects in a region that amounts to 93% or more of an area of the substrate 10, 100. This may be confirmed from the number of wrinkling defects per each unit area in an atomic force microscopy (AFM) image shown in FIG. 1A, which is described later.

The first hexagonal boron nitride sheet 20, 200 may be formed of 1 layer to 90 layers, for example, 1 to 90 layers or 1 to 80 layers. The number of layers of the first hexagonal boron nitride sheet 20, 200 may be adjusted depending on a purpose of an electronic device that ultimately uses the layers. The number of layers of the first hexagonal boron nitride sheet 20, 200 may be confirmed from transmission electron microscope (TEM) images shown in FIGS. 3A, 4A, 5A, and 6A, which are described later.

Boron nitride may make up 95% or more per 1 mm$^2$ area of the first hexagonal boron nitride sheet 20, 200. For example, boron nitride may make up 99% or more per 1 mm$^2$ area of the first hexagonal boron nitride sheet 20, 200. With such a proportion of boron nitride in the first hexagonal boron nitride sheet 20, 200, the first hexagonal boron nitride sheet 20, 200 may be kept homogeneous. Thus, the electronic characteristics of an electronic device which employs the first hexagonal boron nitride sheet 20, 200 may be kept uniform.

The first hexagonal boron nitride sheet 20, 200 may be formed by penetrating of a nitrogen source, a boron source, or nitrogen and boron sources in a gas or solid state which is or are located outside the metal layer 30, 300, via an inside of the metal layer 30, 300 which is formed of a plurality of grain boundaries and its or their diffusing(s) on the substrate 10, 100.

The metal layer 30, 300 has a polycrystalline structure. Thus, the metal layer 30, 300 includes a plurality of grains, which are partitioned by a grain boundary. The first hexagonal boron nitride sheet 20, 200 may be formed by passing of a nitrogen source, a boron source, or nitrogen and boron sources in a gas or solid state which is or are located outside the metal layer 30, 300 into the metal layer 30, 300, via a plurality of the grain boundaries partitioning the plurality of grains, and its or their diffusing(s) on the substrate 10, 100.

In the description, "outside the metal layer 30, 300" refers to an area which is located on, upper, below, or at a side of the metal layer 30, 300, except inside the metal layer 30, 300.

The gas-state nitrogen source may be at least one selected from among $NH_3$ and $N_2$, and the gas-state boron source may be at least one selected from among $BH_3$, $BF_3$, $BCl_3$, $B_2H_6$, $(CH_3CH_2)_3B$, $(CH_3)_3B$, and diborane. The solid-state boron source may include $B_2O_3$. The solid-state nitrogen and boron sources may be at least one selected from among ammonia borane ($H_3NBH_3$), borazine $(BH)_3(NH)_3$, and polyborazylene.

The metal layer 30, 300 may be a catalyst layer formed of at least one metal or an alloy thereof which is selected from the group consisting of nickel (Ni), cobalt (Co), iron (Fe), platinum (Pt), palladium (Pd), gold (Au), aluminum (Al), chrome (Cr), copper (Cu), magnesium (Mg), manganese (Mn), molybdenum (Mo), rhodium (Rh), silicon (Si), thallium (Ta), titanium (Ti), tungsten (W), uranium (U), vanadium (V), and zirconium (Zr). For example, the metal layer 30, 300 may be a catalyst layer which is formed of at least one metal or an alloy thereof, selected from the group consisting of Ni, Fe, Mo, and Cu.

A grain of the metal layer 30, 300 may have an average area of, for example, 1 μm$^2$ to 1,000,000 μm$^2$. For example, a grain of the metal layer 30, 300 may have an average area of 1 μm$^2$ to 80,000 μm$^2$.

An average area of a grain is obtained by using an arithmetic average of an area of each unit grain, instead of a total area of all grains included in the metal layer 30, 300. For example, an average area of the grain may be obtained by visually measuring the number of grains in a certain area, which is provided in an optical image of a surface of a nickel layer shown in FIG. 2 which is described later, for example, in an area of 1 cm×1 cm, and then, dividing the certain area by the number of the grains.

Such an average area of the grain may be increased by using a heat treatment process in a chamber at a high temperature of about 500° C., a physical polishing process, a chemical polishing process, a chemical mechanical polishing process, or an electrolytic polishing process within a range of the average area described above. However, an average area of the grain may not exceed 1,000,000 μm$^2$ so that a nitrogen source, a boron source, or nitrogen and boron sources, in a gas or solid state, which is or are located outside the metal layer 30, 300, may pass through the metal layer 30, 300.

The second hexagonal boron nitride sheet 400 may further be included on the metal layer 30, 300 formed on the first hexagonal boron nitride sheet 20, 200. The second hexagonal boron nitride sheet 400 may be formed by applying a nitrogen source, a boron source, or nitrogen and boron sources, in a gas or solid state, is or are applied to the metal layer 30, 300.

The second hexagonal boron nitride sheet 400 may be formed of 1 to 100 layers, for example, 1 to 90 layers or 1 to 80 layers. The number of layers of the second hexagonal boron nitride sheet 400 may be adjusted within a range of the layers described above depending on a purpose of an electronic device that uses the layers. The number of layers of the second hexagonal boron nitride sheet 400 may be confirmed from TEM images shown in FIGS. 3B, 4B, 5B, and 6B which are described later.

The second hexagonal boron nitride sheet 400 may not include wrinkling defects in a region that amounts to 70% or more of an area of the substrate 10, 100. For example, the second hexagonal boron nitride sheet 400 may not include wrinkling defects in a region that amounts to 70% or more of an area of the substrate 10, 100. This may be confirmed from the number of wrinkling defects per each unit area in an AFM image shown in FIG. 1B which is described later. That is, the number of wrinkling defects included in the second hexagonal boron nitride sheet 400 is higher than the number of wrinkling defects in the first hexagonal boron nitride sheet 20, 200. This is because the metal layer 30, 300, on which the second hexagonal boron nitride sheet 400 is formed, may be expanded by heat treatment and may be influenced by air. On the contrary, the substrate 10, 100, on which the first hexagonal boron nitride sheet 20, 200 is formed, may not be influenced by air, but may be expanded by heat treatment. Additionally, the expansion of the substrate 10, 100 by heat treatment is comparatively less than the expansion of the metal layer 30, 300 by heat treatment at a high temperature.

The substrate 10, 100 may be at least one selected from among a metal or semimetal oxide-based substrate, a silica-based substrate, a boron nitride-based substrate, and a silicon-based substrate. For example, the metal or semimetal oxide-based substrate may be $Al_2O_3$, sapphire, titanium oxide ($TiO_2$), zinc oxide (ZnO), zirconium dioxide ($ZrO_2$), hafnium oxide ($HfO_2$), magnesium oxide (MgO) nickel oxide (NiO), cobalt (II) oxide ($Co_2O$), copper (II) oxide (CuO), iron oxide (FeO), or $SiO_x$, where $0<x\leq2$. The silica-based substrate may be SiO$_2$, glass, or quartz. The substrate 10, 100 may have a thickness of, for example, about 1 mm to about 10 mm.

According to another example embodiment, a method of forming a substrate assembly includes preparing a substrate in a chamber; combining solid state nitrogen and boron sources on the substrate; forming a metal layer on a surface of the substrate on which the solid-state nitrogen and boron sources are combined; and forming a first hexagonal boron nitride sheet, which is directly bonded to the surface of the substrate by performing a heat treatment on the substrate on which the solid-state nitrogen and boron sources are combined and the metal layer is formed.

A type and thickness of the substrate is as described above. For example, a metal or semimetal oxide-based substrate, such as SiO$_x$, where 0<x≤2, may be used.

The solid-state nitrogen and boron sources may be at least one selected from among H$_3$NBH$_3$, (BH)$_3$(NH)$_3$, and polyborazylene. For example, the solid-state nitrogen and boron sources may be H$_3$NBH$_3$. The method of combining solid-state nitrogen and boron sources on the substrate may include a process of applying a polymer, such as polyborazylene, to the substrate, or a process of forming H$_3$NBH$_3$ or (BH)$_3$(NH)$_3$ on the substrate by using a coating method, such as spin coating or bar coating.

A solution, in which the solid-state nitrogen and boron sources are dissolved in an organic solvent in a concentration range from about 1 mM to about 10M, may be employed as the solid-state nitrogen and boron sources. For example, a solution, in which solid-state nitrogen and boron are dissolved in an organic solvent in a concentration range from about 10 mM to about 1M, may be employed. The organic solvent may vary with a type of the solid-state nitrogen and boron sources. Examples of the organic solvent may include tetrahydrofuran (THF), N,N-dimethylformamide (DMF), N-methyl pyrrolidine, and isopropanol (IPA).

The heat treatment may be performed under an inert gas, a hydrogen gas, or a mixture of an inert gas and a hydrogen gas, so as to prevent or inhibit oxidation of the nitrogen and boron sources. An argon gas and a hydrogen gas may be used as the inert gas. If the mixture of an inert gas and a hydrogen gas is used, the inert gas may make up about 60 to about 90 volume percent of a total volume of the chamber, and the hydrogen gas may make up about 5 to about 40 volume percent of a total volume of the chamber. The heat treatment may be performed for about 1 to about 20 hours at a temperature of about 100° C. to about 2000° C. The heat treatment may be performed at a heating rate of 10° C./min to 100° C./min at a range of the temperature described above. The source of the heat treatment can use induction heating, radiant heat, laser, infrared rays (IR), microwaves, plasma, ultraviolet (UV) rays, or surface plasmon heating, but non-limiting sources may be used.

Damage on the substrate may be prevented or inhibited, and volatility from the metal layer and the first hexagonal boron nitride sheet may be prevented or inhibited, due to the supply of the solid-state nitrogen and boron sources in the above-described concentration range and the performance of the heat treatment in the above-described range of the temperature and the hours. As such, the first hexagonal boron nitride sheet, which includes 1 to 100 layers, may be formed. In order to obtain the first hexagonal boron nitride sheet, which includes 1 to 100 layers, the heat-treatment may be maintained, for example, for about 0.001 to about 1,000 hours, or about 10 seconds to 1 hour.

After the heat treatment, a cooling process may further be performed. The cooling process is a process in which the first hexagonal boron nitride sheet is uniformly grown so as to be regularly arranged. For example, the first hexagonal boron nitride sheet may be cooled at a rate of 10° C. to 100° C. per minute. Additionally, the first hexagonal boron nitride sheet may be cooled by applying an inert gas, such as a nitrogen gas, at a certain flow rate or by using a natural cooling method.

The metal layer may be formed by using a metal coating method, such as a chemical deposition method, a physical deposition method, a sputtering method, or an atomic layer deposition (ALD) method. However, a method of forming the metal layer is not limited thereto.

According to another example embodiment, a method of forming a substrate assembly includes preparing a substrate in a chamber; forming a metal layer on the substrate; and forming a first hexagonal boron nitride sheet, which is directly bonded to the substrate, between the substrate and the metal layer by applying a nitrogen source, a boron source, or nitrogen and boron sources in a gas or solid state from outside of the metal layer to the substrate, and then performing a heat treatment on the substrate.

The first hexagonal boron nitride sheet may be formed by penetrating of a nitrogen source, a boron source, or nitrogen and boron sources in a gas or solid state, which is or are applied from outside the metal layer, into an inside of the metal layer, which is formed of a plurality of grain boundaries and its or their diffusing(s) on the substrate.

The method may further include forming the second hexagonal boron nitride sheet, before or simultaneously with the forming of the first hexagonal boron nitride sheet.

In the case that the first and second hexagonal boron nitride sheets are simultaneously formed, both the first and second hexagonal boron nitride sheets have the same shape. Additionally, as a concentration of the nitrogen source, the boron source, or the nitrogen and boron sources, which is or are in a gas or solid state and applied from outside the metal layer, increases, an increasing amount of the nitrogen source, the boron source, or the nitrogen and boron sources penetrates through the inside of the metal layer that is formed of the plurality of grain boundaries.

The heat treatment may be performed at a temperature of about 100 to about 2000° C. for about 1 to about 20 hours under an inert gas, a hydrogen gas, or a mixture of an inert gas and a hydrogen gas. After the heat treatment, a cooling process may be further performed. An argon gas and a helium gas may be used as the inert gas. If the mixture of an inert gas and a hydrogen gas is used, the inert gas may make up about 60 to about 90 volume percent of a total volume of the chamber, and the hydrogen gas may make up about 5 to about 40 volume percent of a total volume of the chamber.

The heat treatment can be performed by using induction heating, radiant heat, laser, IR, microwaves, plasma, UV rays, or surface plasmon heating as a heat source. The heat treatment may be performed at a heating rate of 100° C./min to 10° C./min within a range of the temperature described above. If the heating treatment is performed within a range of the temperature and the hours, damages on the substrate may be prevented or inhibited, and volatility from the metal layer, the first hexagonal boron nitride sheet, and the second hexagonal boron nitride sheet may be prevented or inhibited. Additionally, the first hexagonal boron nitride sheet, which includes 1 to 100 layers, and the second hexagonal boron nitride sheet, which includes fewer layers than the first hexagonal boron nitride sheet, may be obtained.

The heat treatment for obtaining the first hexagonal boron nitride sheet, which includes 1 to 100 layers, and the second hexagonal boron nitride sheet, which includes fewer layers than the first hexagonal boron nitride sheet, may be maintained, for example, for about 0.001 to about 1,000 hours, or about 10 seconds to about 1 hour.

After the heat treatment, a cooling process may be further performed. The cooling process may be performed so that the formed first hexagonal boron nitride sheet may be uniformly grown, and thus, may be regularly arranged. For example, the first hexagonal boron nitride sheet may be cooled at a rate of about 10° C. to about 100° C. per minute. Otherwise, the first hexagonal boron nitride sheet may be cooled by using a natural cooling method.

The gas-state nitrogen source may be at least one selected from among $NH_3$ and $N_2$. The gas-state boron source may be at least one selected from the group consisting of $BH_3$, $BF_3$, $BCl_3$, $B_2H_6$, $(CH_3CH_2)_3B$, $(CH_3)_3B$, and diborane. The solid-state boron source may include $B_2O_3$. The gas-state or solid-state nitrogen and boron sources may be at least one selected from among $H_3NBH_3$, $(BH)_3(NH)_3$, and polyborazylene. For example, the solid-state boron source or the solid-state nitrogen and boron sources is or are stored in an external container, and boiled at a given (or alternatively, predetermined) temperature. Then, the compound, which is the solid-state boron source or the solid-state nitrogen and boron sources, is vaporized or sublimated, and then supplied to a chamber in which the metal layer is placed. A nitrogen gas may be supplied to the chamber, together with solid-state boron source or the solid-state nitrogen and boron sources.

A solution, in which the solid-state nitrogen and boron are dissolved in an organic solvent in a concentration range from about 1 mM to about 10M, may be employed as the solid-state nitrogen and boron sources. For example, a solution, in which solid-state nitrogen and boron are dissolved in an organic solvent in a concentration range from about 10 mM to about 1M, may be employed. The organic solvent may vary with a type of the solid-state nitrogen and boron sources. Examples of the organic solvent may include THF, N,N-dimethylformamide (DMF), N-methyl pyrrolidine, and isopropanol (IPA).

The metal layer may be a catalyst layer formed of at least one metal or an alloy thereof, selected from the group consisting of Ni, Co, Fe, Pt, Pd, Au, Al, Cr, Cu, Mg, Mn, Mo, Rh, Si, Ta, Ti, W, U, V, and Zr. For example, the metal layer may be a catalyst layer formed of at least one metal or alloy thereof, selected from the group consisting of Ni, Fe, Mo, and Cu. The metal layer may be formed by using a metal coating method, such as a chemical deposition method, a physical deposition method, a sputtering method, or an ALD method, but a method of processing the metal layer is not limited thereto.

A type and thickness of the substrate is as described above. For example, a metal-based or semimetal oxide-based substrate, such as $SiO_x$, where $0<x\leq2$, may be used.

Additionally, after forming the substrate assembly by using the method, a method of removing the metal layer may be further performed. A process of using an acid may be performed as the method of removing the metal layer. A given (or alternatively, predetermined) concentration of hydrochloric acid, sulfuric acid, nitric acid, or a mixture thereof may be used for the acidification process. The substrate assembly may be dipped into the hydrochloric acid, the sulfuric acid, the nitric acid, or the mixture thereof for a given (or alternatively, predetermined) time.

According to another example embodiment, an electronic device includes the substrate assembly described above. The substrate assembly may be effectively used in various display devices, such as a field-emission display (FED), a liquid crystal display (LCD), and an organic light-emitting diode (OLED) display; and electronic devices, such as various batteries like a supercapacitor, a fuel cell, and a solar cell, various nanodevices, such as a field-effect transistor (FET) and a memory device, electronic devices, such as a hydrogen storage element, an optical fiber, and a sensor. As the substrate assembly includes the first hexagonal boron nitride sheet that is directly bonded to a surface of the assembly, an additional transfer process is not necessary. Thus, when the substrate assembly is used in the electronic device, damages on the first hexagonal boron nitride sheet may be minimized.

A size of the substrate may be freely adjusted. Thus, the first hexagonal boron nitride sheet may have a large size, with a lateral length and/or a longitudinal length of about 1 mm or more, for example, about 10 mm or more, or about 10 mm to 1,000 m.

Hereinafter, the inventive concepts will be described in detail, by referring to embodiments. However, the inventive concepts are not limited thereto.

EXAMPLE 1

A 3 cm×3 cm silicon substrate, which is coated with $SiO_2$ to a thickness of 100 nm, is prepared. An ultrasonic process is performed on the substrate by alternately using water, ethanol, and acetone. Then, the substrate is washed and dried.

0.647M of an ammonia borane solution, obtained by dissolving 0.02 g of $H_3NBH_3$ in 1 mL of THF, is prepared. In an argon atmosphere reaction chamber, 300 μl of the ammonia borane solution is drop-casted on the substrate. Then, the silicon substrate is spin-coated at 1000 rpm for one minute. Nickel is deposited on a surface of the spin-coated silicon substrate by using e-beam evaporation. Thus, a nickel layer with a thickness of 300 nm is formed.

The silicon substrate is located in a chemical vapor deposition (CVD) chamber. A mixture of 20 volume percent argon and 80 volume percent $H_2$ is applied to the CVD chamber at a flow rate of 100 scfm, by using an inductive heating source, a temperature in the CVD chamber rises to 1000° C. for 1.5 hours at a rate of 10° C. per minute, and the CVD chamber is maintained for an hour at the temperature of 1000° C. Then, the inductive heating source is removed, and the CVD chamber is cooled to room temperature at a rate of 10° C. per minute. Thus, a first hexagonal boron nitride sheet, which is directly bonded to a surface of the substrate, is formed.

EXAMPLE 2

Nickel is deposited on a 3 cm×3 cm silicon substrate, which is coated with $SiO_2$ to a thickness of 100 nm, by using e-beam evaporation. Thus, a nickel layer with a thickness of 300 nm is formed on the silicon substrate. An ultrasonic process is performed on the silicon substrate by alternately using water, ethanol, and acetone. Then, the substrate is washed and dried.

0.647M of an ammonia borane solution, obtained by dissolving 0.02 g of $H_3NBH_3$ in 1 mL of THF, is prepared. In an argon atmosphere reaction chamber, 300 μl of the ammonia borane solution is drop-casted on the silicon substrate. Then, the silicon substrate is spin-coated at 1000 rpm for one minute.

The silicon substrate is located in a CVD chamber. A mixture of 20 volume percent argon and 80 volume percent $H_2$ is applied to the CVD chamber at a flow rate of 100 scfm, and by using an inductive heating source, a heat treatment is performed on the CVD chamber. Thus, a temperature in the CVD chamber rises to 1000° C. for 3 hours at a rate of 100° C. per minute. The CVD chamber is maintained for an hour at the temperature of 1000° C. Then, the inductive heating source is removed, and the CVD chamber is cooled to room temperature at a rate of 20° C. per minute. Thus, a 47-layer first hexagonal boron nitride sheet, which is directly bonded to a surface of the substrate, and an 8-layer second hexagonal boron nitride sheet, on the nickel layer, are formed.

EXAMPLE 3

Nickel is deposited on a 3 cm×3 cm silicon substrate, which is coated with $SiO_2$ to a thickness of 100 nm, by using e-beam evaporation. Thus, a nickel layer with a thickness of 300 nm is formed on the silicon substrate. An ultrasonic process is performed on the silicon substrate by alternately using water, ethanol, and acetone. Then, the substrate is washed and dried.

0.9720M of an ammonia borane solution, obtained by dissolving 0.03 g of $H_3NBH_3$ in 1 mL of THF, is prepared. In an argon atmosphere reaction chamber, 300 μl of the ammonia borane solution is drop-casted on the silicon substrate. Then, the silicon substrate is spin-coated at 5000 rpm for one minute.

The silicon substrate is located in a CVD chamber. A mixture of 20 volume percent argon and 80 volume percent $H_2$ is applied to the CVD chamber at a flow rate of 100 scfm, and by using an inductive heating source, a heat treatment is performed on the CVD chamber. Thus, a temperature in the CVD chamber rises to 1000° C. for 3 hours at a rate of 100° C. per minute. The CVD chamber is maintained for an hour at the temperature of 1000° C. Then, the inductive heating source is removed, and the CVD chamber is cooled to room temperature at a rate of 20° C. per minute. Thus, a 67-layer first hexagonal boron nitride sheet, which is directly bonded to a surface of the substrate, and a 10-layer second hexagonal boron nitride sheet, on the nickel layer, are formed.

EXAMPLE 4

Nickel is deposited on a 3 cm×3 cm silicon substrate, which is coated with $SiO_2$ to a thickness of 100 nm, by using e-beam evaporation. Thus, a nickel layer with a thickness of 300 nm is formed on the silicon substrate. An ultrasonic process is performed on the silicon substrate by alternately using water, ethanol, and acetone. Then, the substrate is washed and dried.

1.29M of an ammonia borane solution, obtained by dissolving 0.04 g of $H_3NBH_3$ in 1 mL of THF, is prepared. In an argon atmosphere reaction chamber, 300 μl of the ammonia borane solution is drop-casted on the silicon substrate. Then, the silicon substrate is spin-coated at 5000 rpm for one minute.

The silicon substrate is located in a CVD chamber. A mixture of 20 volume percent argon and 80 volume percent $H_2$ is applied to the CVD chamber at a flow rate of 100 scfm, and by using an inductive heating source, a heat treatment is performed on the CVD chamber. Thus, a temperature in the CVD chamber rises to 1000° C. for 3 hours at a rate of 100° C. per minute. The CVD chamber is maintained for an hour at the temperature of 1000° C. Then, the inductive heating source is removed, and the CVD chamber is cooled to room temperature at a rate of 20° C. per minute. Thus, a 60-layer first hexagonal boron nitride sheet, which is directly bonded to a surface of the substrate, and a 29-layer second hexagonal boron nitride sheet, on the nickel layer, are formed.

EXAMPLE 5

Nickel is deposited on a 3 cm×3 cm silicon substrate, which is coated with $SiO_2$ to a thickness of 100 nm, by using e-beam evaporation. Thus, a nickel layer with a thickness of 300 nm is formed on the silicon substrate. An ultrasonic process is performed on the silicon substrate by alternately using water, ethanol, and acetone. Then, the substrate is washed and dried.

The silicon substrate is located in a CVD chamber. A mixture of 20 volume percent argon and 80 volume percent $H_2$ is applied to the CVD chamber at a flow rate of 100 scfm, and by using an inductive heating source, a temperature in the CVD chamber rises at a rate of 100° C. per minute. While the temperature in the CVD chamber reaches 400° C., 100 mg of $(BH)_3(NH)_3$ is applied to the CVD chamber. After the CVD chamber is maintained at 400° C. for 30 minutes, the CVD chamber is heat-treated for 2 hours, so as to reach a temperature of 1000° C. Then, the inductive heating source is removed, and the CVD chamber is cooled to room temperature at a rate of 20° C. per minute. Thus, a 62-layer first hexagonal boron nitride sheet, which is directly bonded to a surface of the substrate, and a 44-layer second hexagonal boron nitride sheet, on the nickel layer, are formed.

EXPERIMENTAL EXAMPLE 1: An AFM (Atomic Force Microscopy) Image of a Hexagonal Boron Nitride Sheet FIGS. 1A and 1B illustrate AFM images of the first and second hexagonal boron nitride sheets, which are formed in the substrate assembly of Example 2.

Figure 1A:
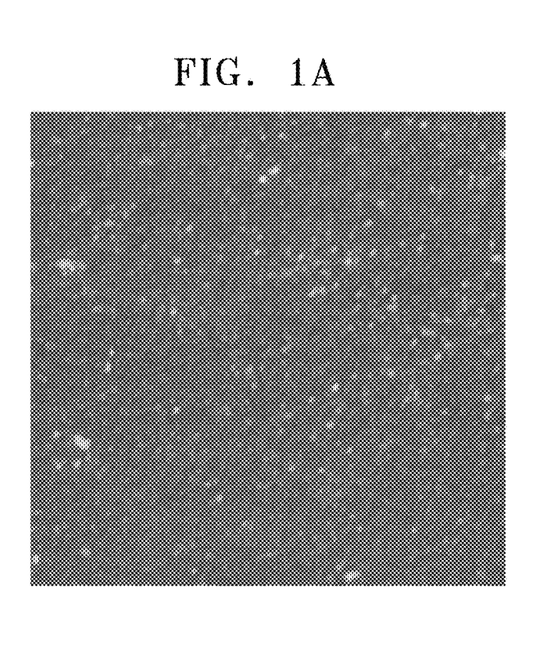
FIG. 1A is an atomic force microscopy (AFM) image of a first hexagonal boron nitride sheet included in a substrate assembly of Example 2.
Figure 1B:
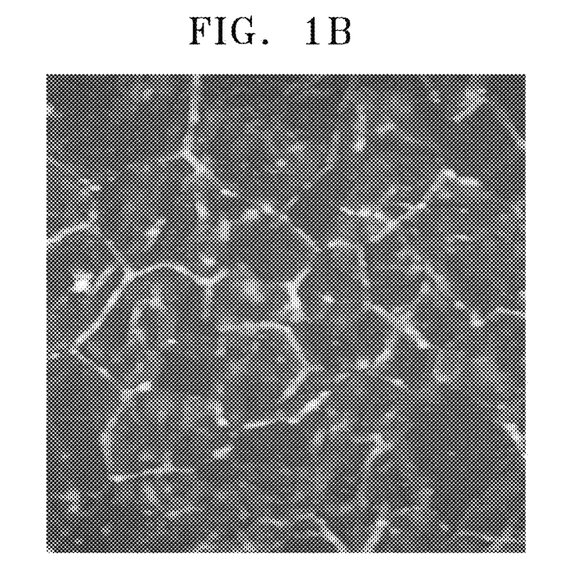
FIG. 1B is an AFM image of a second hexagonal boron nitride sheet included in the substrate assembly of Example 2.

FIGS. 1A and 1B respectively show an optical image of which a total area is covered with the first hexagonal boron nitride sheet and the second hexagonal boron nitride sheet, which have a total area of 50×60 $um^2$, without a vacant space.

A result of analyzing the first hexagonal boron nitride sheet, manufactured by the Example 2, shows that the first hexagonal boron nitride sheet, which includes a relatively uniform surface, is formed. The first hexagonal boron nitride sheet may not include wrinkling defects in a region that amounts to 90% or more of a total area of the substrate. Whereas, the second hexagonal boron nitride sheet may not include wrinkling defects in a region that amounts to 70% or more of a total area of the substrate.

Additionally, a result of analyzing the total area of the first hexagonal boron nitride sheet, by dividing the total area in units of 0.01 $mm^2$, shows that 95% or more per 1 $mm^2$ area per 1 $mm^2$ is covered with boron nitride.

EXPERIMENTAL EXAMPLE 2: An Optical Surface Image of the Metal Layer

Figure 2:
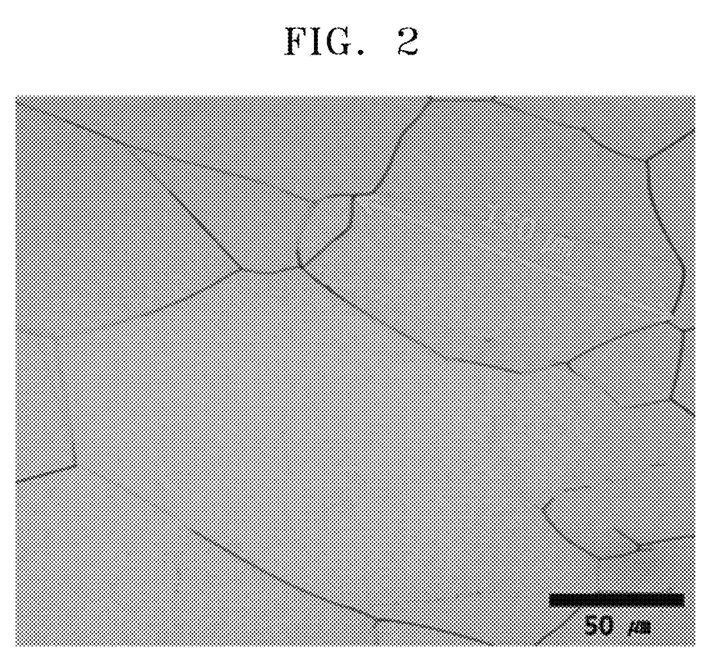
FIG. 2 is an optical surface image of a nickel layer included in the substrate assembly of Example 2.
Figure 3A:
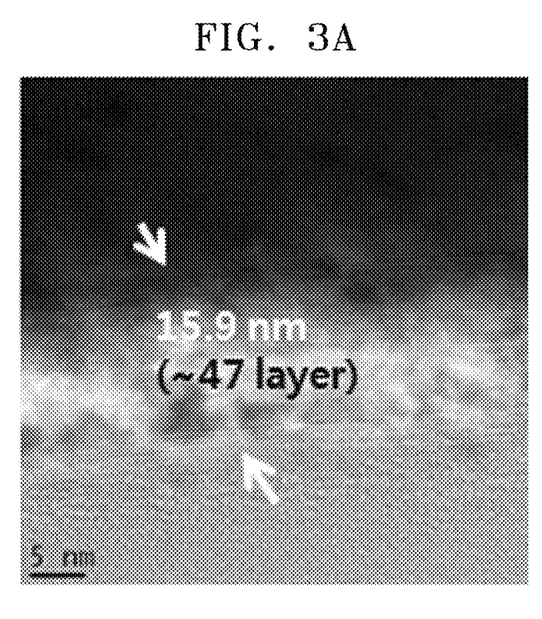
FIG. 3A is a transmission electron microscope (TEM) image of the first hexagonal boron nitride sheet included in the substrate assembly of Example 2.
Figure 3B:
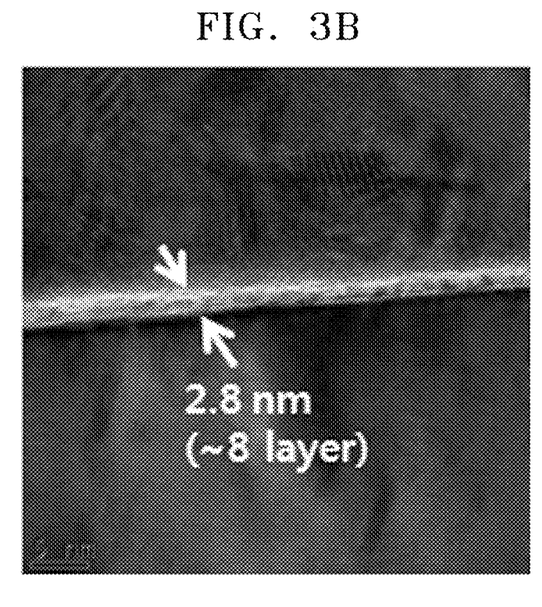
FIG. 3B is a TEM image of the second hexagonal boron nitride sheet included in the substrate assembly of Example 2.
Figure 4A:
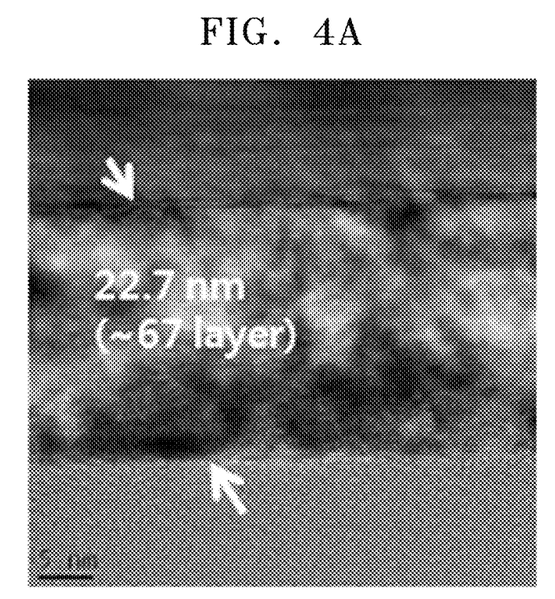
FIG. 4A is a TEM image of a first hexagonal boron nitride sheet included in the substrate assembly of Example 3.
Figure 4B:
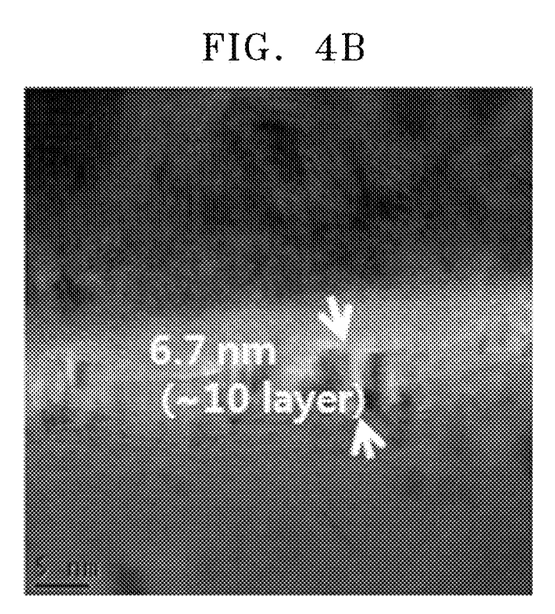
FIG. 4B is a TEM image of a second hexagonal boron nitride sheet included in the substrate assembly of Example 3.
Figure 5A:
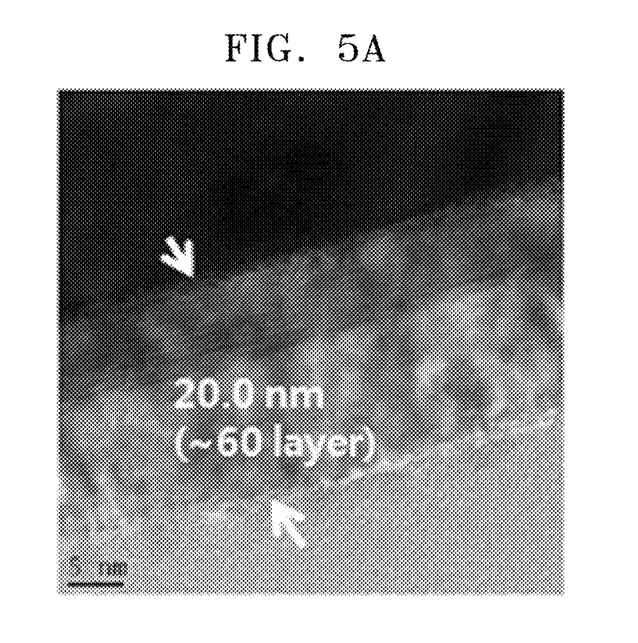
FIG. 5A is a TEM image of a first hexagonal boron nitride sheet included in the substrate assembly of Example 4.
Figure 5B:
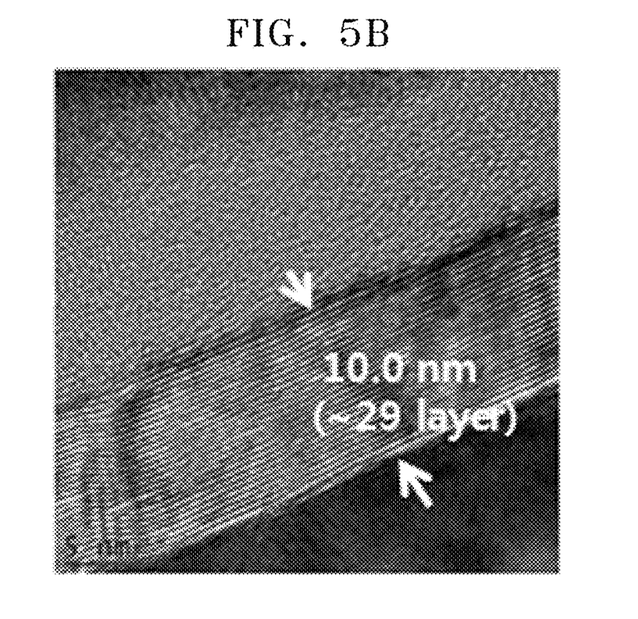
FIG. 5B is a TEM image of a second hexagonal boron nitride sheet included in the substrate assembly of Example 4.
Figure 6A:
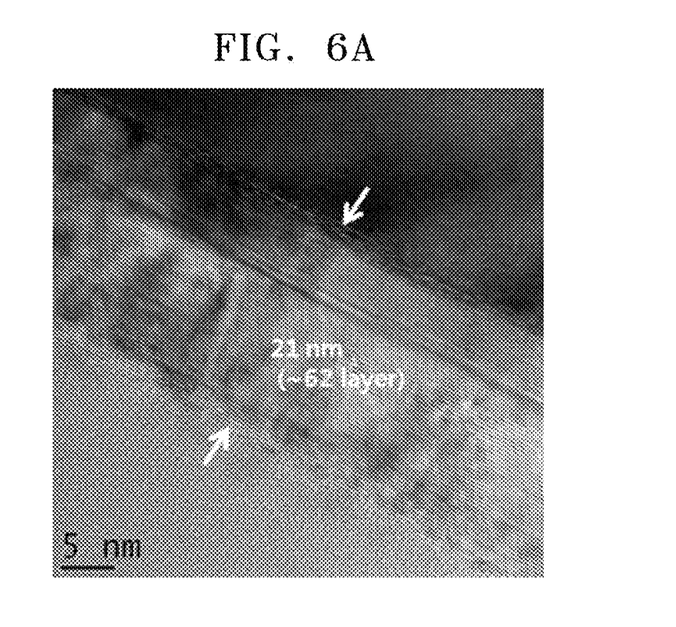
FIG. 6A is a TEM image of a first hexagonal boron nitride sheet included in the substrate assembly of Example 5.
Figure 6B:
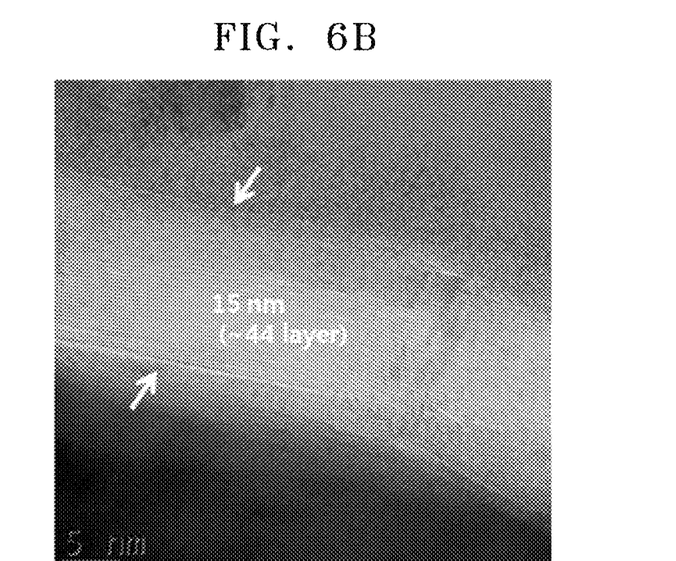
FIG. 6B is a TEM image of a second hexagonal boron nitride sheet included in the substrate assembly of Example 5.

FIG. 2 illustrates an optical surface image of the nickel layer which has a total area of 250×200 $um^2$ and formed on the 4-inch substrate assembly of Example 2.

As illustrated in FIG. 2, the nickel layer, which is formed on the substrate of Example 2, is mainly formed of grains with a size of about 150 μm. Referring to FIG. 2, grains of the nickel layer, formed in the substrate assembly of Example 2, have an area of about 70,650 $μm^2$.

EXPERIMENTAL EXAMPLE 3: A TEM Image

A TEM image, in which a cross section of the first and second hexagonal boron nitride sheets that are formed in the substrate assembly of Examples 2 through 5 is measured, is respectively illustrated in FIGS. 3A, 3B, 4A, 4B, 5A, 5B, 6A, and 6B.

As illustrated in FIGS. 3A, 3B, 4A, 4B, 5A, 5B, 6A, and 6B, the first hexagonal boron nitride sheet, formed on the substrate of Examples 2 through 5 is directly bonded to a surface of the substrate, and the second hexagonal boron nitride sheet is formed on the metal layer.

The first hexagonal boron nitride sheet is respectively formed of 47 layers, 67 layers, 60 layers, and 62 layers on the substrate assembly of Examples 2 through 5. The second hexagonal boron nitride sheet is respectively formed of 8 layers, 10 layers, 29 layers, and 44 layers on the nickel layer.

EXPERIMENTAL EXAMPLE 4: Raman Spectrum

A Raman spectrum of the first and second hexagonal boron nitride sheets, which are formed in the substrate assembly of Example 2, is measured by using an $Ar^+$ ion laser with a wavelength of 514 nm. A result of measuring the Raman spectrum is shown in FIGS. 7A and 7B.

Figure 7A:
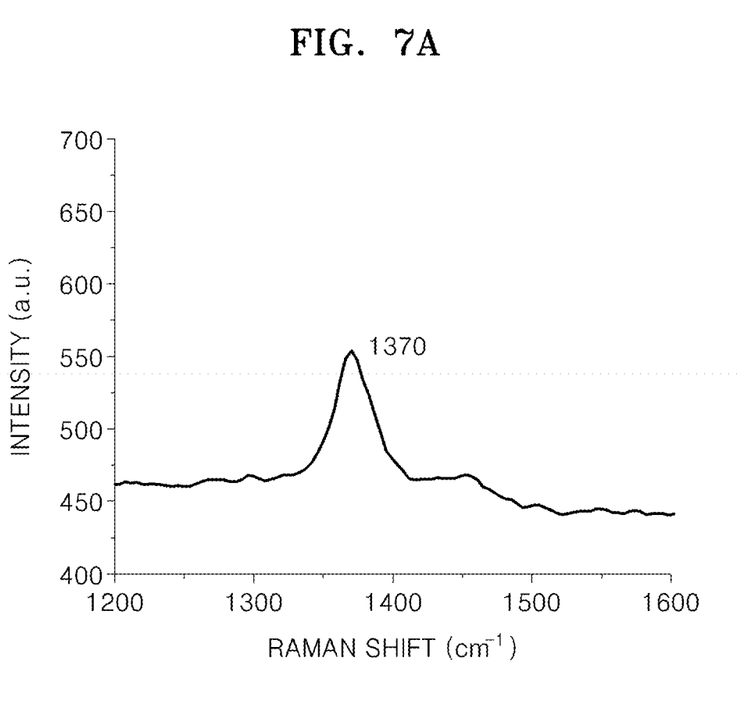
FIG. 7A is a Raman spectrum of the first and second hexagonal boron nitride sheets included in the substrate assembly of Example 2 by using an Ar+ ion laser with a wavelength of 514 nm.
Figure 7B:
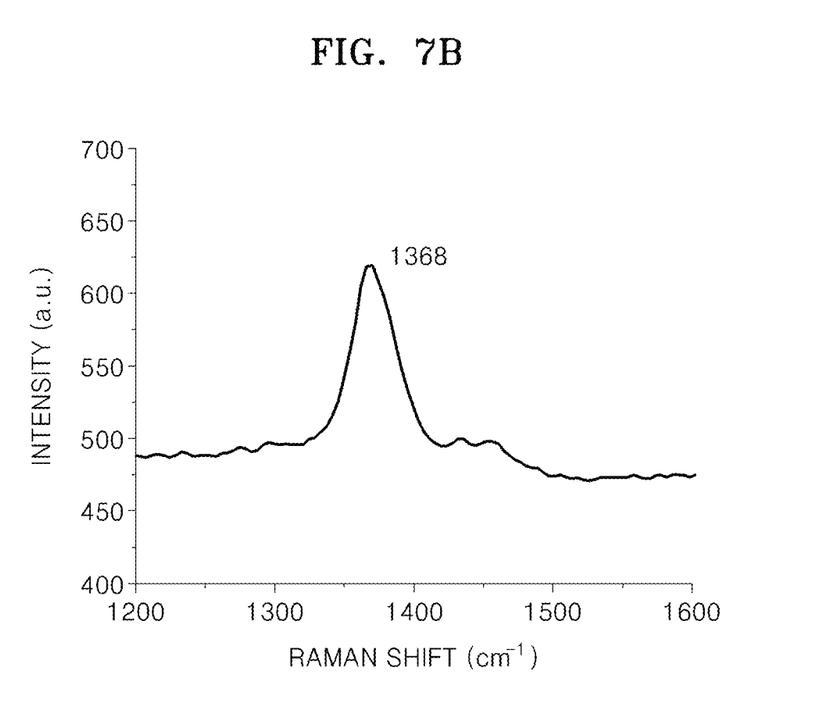
FIG. 7B is a Raman spectrum of the second hexagonal boron nitride sheet included in the substrate assembly of Example 2 by using an Ar+ ion laser with a wavelength of 514 nm.

As shown in FIGS. 7A and 7B, the formation of a hexagonal boron nitride sheet may be identified from a peak near 1368 $cm^{-1}$ to 1370 $cm^{-1}$. The peak near 1368 $cm^{-1}$ to 1370 $cm^{-1}$ may be identified when observed at any point in the AFM images shown in FIGS. 1A and 1B.

EXPERIMENTAL EXAMPLE 5: An X-Ray Photoelectron Spectroscopy (XPS) Depth Profile

A depth profile of the substrate assembly of Example 2, is analyzed by using an XPS, which is Physical Electronics QUANTUM 2000. The result of the analyzing is shown in FIG. 9.

As illustrated in FIG. 9, the first hexagonal boron nitride sheet is formed to be directly bonded to a surface of the substrate, and the second hexagonal boron nitride sheet is formed on the nickel layer.

As described above, according to the one or more of the above example embodiments, the substrate assembly, which includes a hexagonal boron nitride sheet, which is directly bonded to a surface of the substrate, and the method of forming the substrate assembly do not need an additional transfer process. Thus, defects on the substrate assembly may be minimized or reduced, and the number of layers of the hexagonal boron nitride sheet may be more easily adjusted.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. A method of forming a substrate assembly, the method comprising:
   placing a metal or semimetal oxide-based substrate in a reaction chamber under an inert gas, a hydrogen gas, or a mixture of an inert gas and a hydrogen gas;
   combining a solid-state nitrogen source and a boron source on the substrate;
   forming a metal layer on a surface of the substrate including the combined solid-state nitrogen and boron sources; and
   forming a first hexagonal boron nitride sheet directly bonded to the surface of the substrate by performing a heat treatment on the substrate including the metal layer and the combined solid-state nitrogen and boron sources.

2. The method of claim 1, wherein the combining combines at least one of ammonia borane ($H_3NBH_3$), borazine (($BH)_3(NH)_3$), and polyborazylene.

3. The method of claim 1, further comprising:
   dissolving the solid-state nitrogen and boron sources in an organic solvent in a concentration range from 1 mM to 10M prior to the combining.

4. The method of claim 1, wherein the forming the first hexagonal boron nitride sheet includes simultaneously performing the heat treatment on the substrate and exposing the substrate to one of an inert gas, a hydrogen gas, and a mixture of an inert gas and a hydrogen gas.

5. The method of claim 1, wherein the forming the first hexagonal boron nitride sheet includes performing the heat treatment for 1 to 20 hours at a temperature of 100° C. to 2,000° C.

6. A method of forming a substrate assembly, the method comprising:
   placing a metal or semimetal oxide-based substrate in a reaction chamber under an inert gas, a hydrogen gas, or a mixture of an inert gas and a hydrogen gas;
   forming a metal layer on the substrate; and
   forming a first hexagonal boron nitride sheet between the substrate and the metal layer, the first hexagonal boron nitride sheet being directly bonded to a surface of the substrate, the forming a first hexagonal boron nitride sheet including,
   applying at least one of a nitrogen source and a boron source in one of a gas and solid state to the substrate from outside the metal layer, and
   performing a heat treatment on the substrate.

7. The method of claim 6, further comprising:
   forming a second hexagonal boron nitride sheet prior to or simultaneously with the forming a first hexagonal boron nitride sheet.

8. The method of claim 6, wherein the performing performs the heat treatment for 1 to 20 hours at a temperature of 100° C. to 2,000° C. under one of an inert gas, a hydrogen gas, and a mixture of an inert gas and a hydrogen gas.

9. The method of claim 6, wherein
   the applying applies a gas-state nitrogen source including at least one of $NH_3$ and $N_2$, and
   the applying applies a gas-state boron source including at least one of $BH_3$, $BF_3$, $BCl_3$, $B_2H_6$, $(CH_3CH_2)_3B$, $(CH_3)_3B$, and diborane.

10. The method of claim 6, wherein the applying applies a solid-state boron source including $B_2O_3$.

11. The method of claim 6, wherein the applying applies at least one of $H_3NBH_3$, $(BH)_3(NH)_3$, and polyborazylene.

* * * * *